US012742239B2

(12) United States Patent
Kim et al.

(10) Patent No.: US 12,742,239 B2
(45) Date of Patent: Sep. 22, 2026

(54) COOLING FRAME FOR DIFFUSER

(71) Applicant: Applied Materials, Inc., Santa Clara, CA (US)

(72) Inventors: Jong Yun Kim, Gyeonggi-do (KR); William Nehrer, Soquel, CA (US); Sang Jeong Oh, Santa Clara, CA (US); Han Byoul Kim, Gyeonggi-do (KR)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/717,165

(22) PCT Filed: Dec. 6, 2021

(86) PCT No.: PCT/US2021/062031
§ 371 (c)(1),
(2) Date: Jun. 6, 2024

(87) PCT Pub. No.: WO2023/107091
PCT Pub. Date: Jun. 15, 2023

(65) Prior Publication Data
US 2025/0019824 A1 Jan. 16, 2025

(51) Int. Cl.
*C23C 16/44* (2006.01)
*C23C 16/455* (2006.01)
*C23C 16/505* (2006.01)

(52) U.S. Cl.
CPC .... *C23C 16/4411* (2013.01); *C23C 16/45559* (2013.01); *C23C 16/505* (2013.01)

(58) Field of Classification Search
CPC ............ C23C 16/463; C23C 16/45572; C23C 16/4411; C23C 16/45559; C23C 16/505;
(Continued)

(56) References Cited

U.S. PATENT DOCUMENTS 2,823,652 A * 2/1958 Mader .................... F22B 21/26 122/250 R
4,556,104 A * 12/1985 Engelhardt ............ F28D 7/024 165/145
(Continued)

FOREIGN PATENT DOCUMENTS

JP 2019537267 A 12/2019
KR 19980057826 U 10/1998
(Continued)

OTHER PUBLICATIONS

International Search Report and Written Opinion for PCT/US2021/062031 mailed Aug. 31, 2022, 11 pages.
(Continued)

*Primary Examiner* — Tho V Duong
(74) *Attorney, Agent, or Firm* — Kilpatrick Townsend & Stockton LLP

(57) ABSTRACT

Exemplary substrate processing chambers may include a chamber body defining a processing region. The chambers may include a backing plate disposed atop the chamber body, a diffuser above the processing region and supported by the backing plate, and a cooling frame disposed between the backing plate and the diffuser. The cooling frame may be coupled with the diffuser. The cooling frame may include a body having one or more fluid inlets and one or more fluid outlets. The body may define an opening. The fluid inlets may be in fluid communication with the one or more fluid outlets via one or more fluid lumens that each extend at least partially about a periphery of the opening. The fluid inlets may be in fluid communication with one or more fluid supply lumens. The fluid outlets may be in fluid communication with one or more fluid return lumens.

20 Claims, 6 Drawing Sheets

(58) Field of Classification Search
CPC .......... C23C 16/4405; C23C 16/45565; C23C 16/4585; C23C 16/5096; H10D 30/67
See application file for complete search history.

(56) References Cited

U.S. PATENT DOCUMENTS

| | | | | |
|---|---|---|---|---|
| 5,150,831 | A * | 9/1992 | Jordan | F28D 1/06 228/183 |
| 5,667,758 | A * | 9/1997 | Matsugi | B01J 3/046 220/585 |
| 6,213,757 | B1 * | 4/2001 | Kushch | F24H 1/40 126/92 C |
| 2002/0046807 | A1 * | 4/2002 | Hongo | H01J 37/32522 118/724 |
| 2005/0274499 | A1 * | 12/2005 | Rule | F28D 1/06 165/129 |
| 2009/0201622 | A1 * | 8/2009 | Brown | H01L 21/6831 361/234 |
| 2010/0064717 | A1 * | 3/2010 | Burn | F25C 1/14 62/353 |
| 2013/0145989 | A1 | 6/2013 | Satitpunwaycha | |
| 2014/0083361 | A1 | 3/2014 | Rocha-Alvarez et al. | |
| 2014/0311411 | A1 * | 10/2014 | Yang | C23C 16/45572 118/733 |

FOREIGN PATENT DOCUMENTS

| | | | | |
|---|---|---|---|---|
| KR | 20100098509 | A | 9/2010 | |
| WO | WO-2011017222 | A2 * | 2/2011 | C23C 16/45565 |

OTHER PUBLICATIONS

International Preliminary Report on Patentability for PCT/US2021/062031 issued Jun. 5, 2024, 8 pages.

Korean Application No. 10-2024-7022627, Office Action mailed on Jan. 29, 2026, 18 pages (8 pages of original document and 10 pages of English Translation).

* cited by examiner 305
314
325a
325b
319
318
310
311
330
355
335

COOLING FRAME FOR DIFFUSER

CROSS-REFERENCE TO RELATED APPLICATIONS

The present application is a 35 U.S.C. § 371 National Stage patent application of International patent application PCT/US2021/062031, entitled "COOLING FRAME FOR DIFFUSER," filed on Dec. 6, 2021, the entire contents of which are incorporated by reference.

TECHNICAL FIELD

The present technology relates to components and apparatuses for glass substrate and semiconductor substrate manufacturing. More specifically, the present technology relates to processing chamber components and other substrate processing equipment.

BACKGROUND

Liquid crystal displays or flat panels are commonly used for active matrix displays, such as computer, television, and other monitors. Plasma enhanced chemical vapor deposition (PECVD) is used to deposit thin films on a substrate, such as a semiconductor wafer or a transparent substrate for a flat panel display. PECVD is generally accomplished by introducing a precursor gas or gas mixture into a vacuum chamber containing a substrate. The precursor gas or gas mixture is typically directed downwardly through a distribution plate situated near the top of the processing chamber. The precursor gas or gas mixture in the processing chamber is energized (e.g., excited) into a plasma by applying a power, such as a radio frequency (RF) power, to an electrode in the processing chamber from one or more power sources coupled to the electrode. The excited gas or gas mixture reacts to form a layer of material on a surface of the substrate. The layer may be, for example, a passivation layer, a gate insulator, a buffer layer, and/or an etch stop layer. The layer may be a part of a larger structure, such as, for example, a thin film transistor (TFT) or an active matrix organic light emitting diodes (AMOLED) used in a display device.

Flat panels processed by PECVD techniques are typically large. For example, the flat panel may exceed 4 square meters. During processing, the gases are flowed through a diffuser, which helps distribute the gases uniformly across a processing region of the chamber. The generation of plasma within the chamber, as well as the heating of the susceptor, may generate heat within the processing chamber that increases the temperature of the diffuser. Such temperature changes in the diffuser may cause various problems that may reduce the substrate quality and/or may damage the diffuser.

Thus, there is a need for improved systems and methods for maintaining diffusers within a desired temperature range during processing operations. These and other needs are addressed by the present technology.

SUMMARY

Exemplary substrate processing chambers may include a chamber body defining a processing region. The chambers may include a backing plate disposed atop the chamber body. The chambers may include a diffuser above the processing region and supported by the backing plate. The chambers may include a cooling frame disposed between the backing plate and the diffuser. The cooling frame may be coupled with the diffuser. The cooling frame may include a body having one or more fluid inlets and one or more fluid outlets. The body may define an opening. The one or more fluid inlets may be in fluid communication with the one or more fluid outlets via one or more fluid lumens that each extend at least partially about a periphery of the opening. The one or more fluid inlets may be in fluid communication with one or more fluid supply lumens. The one or more fluid outlets may be in fluid communication with one or more fluid return lumens.

In some embodiments, the cooling frame may be disposed along an upper surface of the diffuser. The cooling frame may be attached to an upper surface of the diffuser via indium bonding. The body of the cooling frame may extend about an outer periphery of the diffuser. The outer periphery of the diffuser may include a stepped profile that receives the cooling frame. The one or more fluid lumens may include one or more sections of flexible tubing. The cooling frame may include two or more fluid inlets, two or more fluid outlets, and two or more fluid lumens. At least one of the two or more fluid lumens may extend clockwise about the body of the cooling frame. At least one of the two or more fluid lumens may extend counter-clockwise about the body of the cooling frame. The backing plate may define one or more supply channels in fluid communication with the one or more fluid supply lumens. The backing plate may define one or more return channels in fluid communication with the one or more fluid return lumens. A cleaning fluid supply lumen may be in fluid communication with the one or more fluid inlets. A cleaning fluid return lumen may be in fluid communication with the one or more fluid outlets.

Some embodiments of the present technology may encompass diffuser cooling frames. The diffuser cooling frames may include a body having one or more fluid inlets and one or more fluid outlets. The body may define an opening. The one or more fluid inlets may be in fluid communication with the one or more fluid outlets via one or more fluid lumens. The one or more fluid lumens may form one or more fluid passageways around an outer perimeter of the body of the cooling frame.

In some embodiments, the one or more fluid lumens may include a first fluid lumen that extends about substantially all of an outer periphery of the opening. The one or more fluid lumens may include a second fluid lumen that extends about substantially all of the outer periphery of the opening. The second fluid lumen may be disposed radially inward of the first fluid lumen. The one or more fluid inlets and one or more fluid outlets may be positioned on an upper surface of the cooling frame. The diffuser cooling frame may be coupled with a diffuser. The cooling frame may be attached to an upper surface of the diffuser via indium bonding. The cooling frame may include two or more fluid lumens that each connect one of the fluid inlets to a respective one of the fluid outlets. A first fluid path defined by a first fluid lumen of the two or more fluid lumens may extend clockwise around the body of the cooling frame. A second fluid path defined by a second fluid lumen of the two or more fluid lumens may extend counter-clockwise around the body of the cooling frame. The body of the cooling frame, the one or more fluid lumens, or both may be constructed from an aluminum alloy.

Some embodiments of the present technology may encompass substrate processing methods. The methods may include positioning a substrate on a susceptor that is disposed within a processing chamber, flowing a precursor into the processing chamber through a diffuser, generating a plasma of the precursor within a processing region of the processing chamber; flowing a cooling fluid into a cooling frame disposed above the diffuser, and depositing a material on the substrate.

In some embodiments, the cooling fluid maintains a temperature of the diffuser at less than or about 150° C. The methods may include subsequent to depositing a material on the substrate, halting the flow of the precursor and the cooling fluid and flowing a cleaning fluid into the cooling frame. The cooling fluid may be or include deionized water.

Such technology may provide numerous benefits over conventional systems and techniques. For example, embodiments of the present technology may utilize cooling frames that include fluid lumens that provide cooling to diffusers during processing. Additionally, embodiments may utilize diffusers that include stepped profiles for accommodating and receiving the cooling frames. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
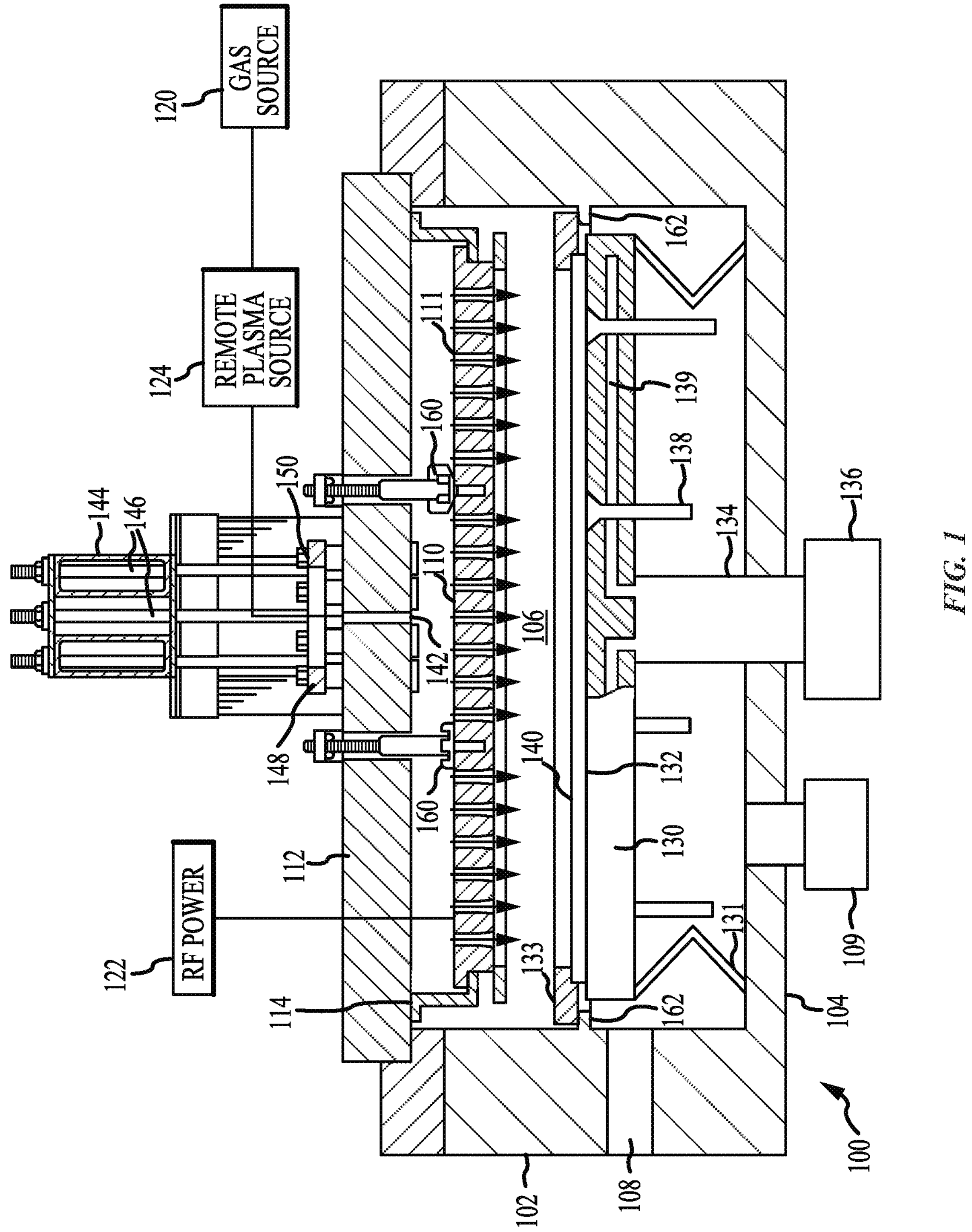
FIG. 1 shows a cross-sectional side elevation view of an exemplary substrate processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. Any number of material films may be produced to develop glass display structures, including conductive and dielectric films, as well as films to facilitate transfer and removal of materials. For example, hardmask films may be formed to facilitate patterning of a substrate, while protecting the underlying materials to be otherwise maintained. In many processing chambers, a number of precursors may be mixed in a gas panel and delivered to a processing region of a chamber where a substrate may be disposed. While components of the lid stack may impact flow distribution into the processing chamber, many other process variables may similarly impact deposition rate and uniformity of deposition.

During processing operations, heat may be generated that may increase the temperature of the diffuser. For example, heat produced from the generation of plasma, heat radiated from the susceptor, and/or other heat sources may cause the temperature of the diffuser to rise and/or otherwise drift over the duration of the processing operation. During low temperature operations, the temperature drift of the diffuser may lead to deposition rate changes, which may lead to greater film non-uniformity on the substrate. Additionally, the clean rate may degrade with increased diffuser temperatures. During high temperature operations, the temperature drift of the diffuser may lead to damage to the diffuser. For example, the high temperatures may cause the anodized surface of the diffuser to peel due to the coefficient of thermal expansion mismatch between the aluminum and its oxide. Additionally, particulate, such as zinc particles, may separate from the diffuser, which may result in particles that may contaminate the film deposited on the substrate. High temperatures may also cause the diffuser to deform, such as by sagging near the periphery of the diffuser. High diffuser temperatures may also result in damage to nearby components, such as insulators, which may lead to particle generation that may cause fall on defects on the substrate. The high temperatures may also lead to power loss due to an increase in resistance from the excess heat. Conventional diffusers do not include a temperature management tool and, therefore, may not be able to readily control temperatures of the diffuser. When the temperature of the diffuser is not controlled during processing, deposition properties and chamber and/or component integrity may be affected as described above.

The present technology overcomes these challenges by utilizing cooling frames that enable temperatures of the diffusers to be controlled during processing. For example, the cooling frames may enable a cooling fluid to be circulated about the diffuser, which may help maintain a temperature of the diffuser within a desired range during processing operations. The cooling frame may have one or more fluid inlets in fluid communication with the one or more fluid outlets via one or more fluid lumens that each extend at least partially about a periphery of an opening defined by the cooling frame. In this manner, deposition characteristics and chamber/chamber component integrity may be maintained during temperatures applied to the diffuser, directly or indirectly, during processing. Accordingly, the present technology may improve the deposition of materials, as well as improve the quality of the processed substrate.

Although the remaining disclosure will routinely identify specific deposition processes utilizing the disclosed technology, it will be readily understood that the systems and methods are equally applicable to other deposition and cleaning chambers, as well as processes that may occur in the described chambers. Accordingly, the technology should not be considered to be so limited as for use with these specific deposition processes or chambers alone. The disclosure will discuss one possible system and chamber that may include lid stack components according to embodiments of the present technology before additional variations and adjustments to this system according to embodiments of the present technology are described.

FIG. 1 is a cross sectional side elevation view of a PECVD apparatus according to some embodiments of the present technology. The apparatus may include a processing chamber 100 in which one or more films may be deposited onto a substrate 140. The apparatus may be used to process one or more substrates, for example, semiconductor substrates, flat panel display substrates, and/or solar panel substrates, among others.

The processing chamber 100 may include chamber walls 102, a bottom 104, and a showerhead or diffuser 110 that define a processing volume 106. A susceptor (or other substrate support) 130 may be disposed in the processing volume 106. The susceptor 130 may include a substrate receiving surface 132 for supporting the substrate 140. The process volume 106 may be accessed through an opening 108 defined through the chamber walls 102 such that the substrate 140 may be transferred in and out of the chamber 100 when the susceptor 130 is in a lowered or transfer position. One or more stems 134 may be coupled to a lift system 136 to translate the susceptor 130 within the chamber 100. As shown in FIG. 1, the substrate is in a lowered position where the substrate 140 can be transferring into and out of the chamber 100. The substrate 140 may be elevated to a processing position for processing. The spacing between the top surface of the substrate 140 disposed on the substrate receiving surface 132 and the diffuser 110 may be between about 400 mil and about 1,200 mil when the susceptor 130 is raised to the processing position. In one embodiment, the spacing may be between about 400 mil and about 800 mil.

Lift pins 138 may be moveably disposed through the susceptor 130 to space the substrate 140 from the substrate receiving surface 132 to facilitate robotic transfer of the substrate 140. The susceptor 130 may also include heating and/or cooling elements 139 to maintain the susceptor 130 at a desired temperature. The susceptor 130 may also include RF return straps 131 to provide a RF return path at the periphery of the susceptor 130.

A backing plate 112 may be disposed atop the chamber body. The diffuser 110 may be coupled to the backing plate 112 at its periphery by a suspension 114. The diffuser 110 may also be coupled to the backing plate 112 by one or more coupling supports 160 to help prevent sag and/or control the straightness/curvature of the diffuser 110.

A gas source 120 may be coupled to the backing plate 112 to provide processing gas through a gas outlet 142 in the backing plate 112 and through gas passages 111 in the diffuser 110 to the substrate 140 disposed on the substrate receiving surface 132. A vacuum pump 109 may be coupled to the chamber 100 to control the pressure within the process volume 106. An RF power source 122 may be coupled to the backing plate 112 and/or to the diffuser 110 to provide RF power to the diffuser 110. The RF power may create an electric field between the diffuser 110 and the susceptor 130 so that a plasma may be generated from the gases between the diffuser 110 and the susceptor 130. Various frequencies may be used, such as a frequency between about 0.3 MHz and about 200 MHz. In one embodiment, the RF power source may be provided at a frequency of 13.56 MHz.

A remote plasma source 124, such as an inductively coupled remote plasma source, may also be coupled between the gas source 120 and the backing plate 112. Between processing substrates, a cleaning gas may be provided to the remote plasma source 124 so that a remote plasma is generated and provided into the processing volume 106 to clean chamber components. The cleaning gas may be further excited while in the processing volume 106 by power applied to the diffuser 110 from the RF power source 122. Suitable cleaning gases include but are not limited to $NF_3$, $F_2$, and $SF_6$.

A frame 133 may be placed adjacent to the periphery region of the substrate 140, either in contact with or spaced from the substrate 140. In some embodiments, the frame 133 may be configured to be disposed under the substrate 140. In other embodiments, the frame 133 may be configured to be disposed over the substrate 140. The frame 133 may be a shadow frame, a non-contact frame (e.g., the frame is not in contact with a substrate when positioned on the susceptor 130), a floating frame, a removable frame, a confinement ring, a flow control structure, or other suitable structure positionable adjacent the periphery of the substrate 140. The frame 133 may have a similar shape as the susceptor 130 in some embodiments. For example, the susceptor 130 and frame 133 may each be rectangular and include multiple sides.

In the embodiment depicted in FIG. 1, the frame 133 may rest on a frame support 162 when the susceptor 130 is lowered to provide clearance for the substrate 140 being placed on or removed from the susceptor 130. In one embodiment, the frame support 162 may include the same material as the chamber walls 102. In another embodiment, the frame support 162 may comprise a conductive material, dielectric material, stainless steel or aluminum. The frame 133 may reduce deposition at the edge of the substrate 140 and on areas of the susceptor 130 that are not covered by the substrate 140. When the susceptor 130 is elevated to the processing position, the frame 133 may engage the substrate 140 and/or susceptor 130, and be lifted off of the frame support 162.

During the cleaning process, the frame 133 may rest on the frame support 162. The substrate receiving surface 132 may also be raised to a level that touches the frame 133 without lifting the frame 133 off from the frame support 162 during cleaning.

The susceptor 130 may have an outer periphery. In some embodiments, the frame 133 or portions thereof, when seated on the susceptor 130, may extend beyond portions of the perimeter of the susceptor 130, and as such, define of the outer profile of the periphery of the susceptor 130. An amount of open area between the susceptor 130 and chamber walls 102 of the processing chamber 100 may control the amount of gas passing by the susceptor 130 and substrate 140 positioned thereon. Thus, by having more open area proximate one region of the susceptor 130 relative to another region, the amount of gas flowing by one region of the susceptor 130 and substrate 140 relative to another may be controlled. For example, the open area proximate a center region of the susceptor 130 may be different than the open area proximate a corner region of the susceptor 130, thus directing more flow through the area with more open area. Directing more flow to one region may be utilized to compensate for other conductance asymmetries to produce a more uniform flow across the substrate, or to cause more gas to flow over one region of the substrate relative another. In one example, flow may be directed to a center region of the susceptor 130 relative to a corner region. In another example, flow may be directed to a corner region of the susceptor 130 relative to a center region. In another example, flow may be directed to one side of the susceptor 130 relative to another side. The open area on a side of the susceptor 130 may be selected by selecting the geometry of the profile of the susceptor 130 to control the width across a gap between the profile of the susceptor 130 and chamber wall 102 of the processing chamber 100, such as the curvature of the perimeter of the susceptor 130 and/or frame 133; and/or selecting a diameter and/or number of apertures formed through the frame 133.

Figure 2:
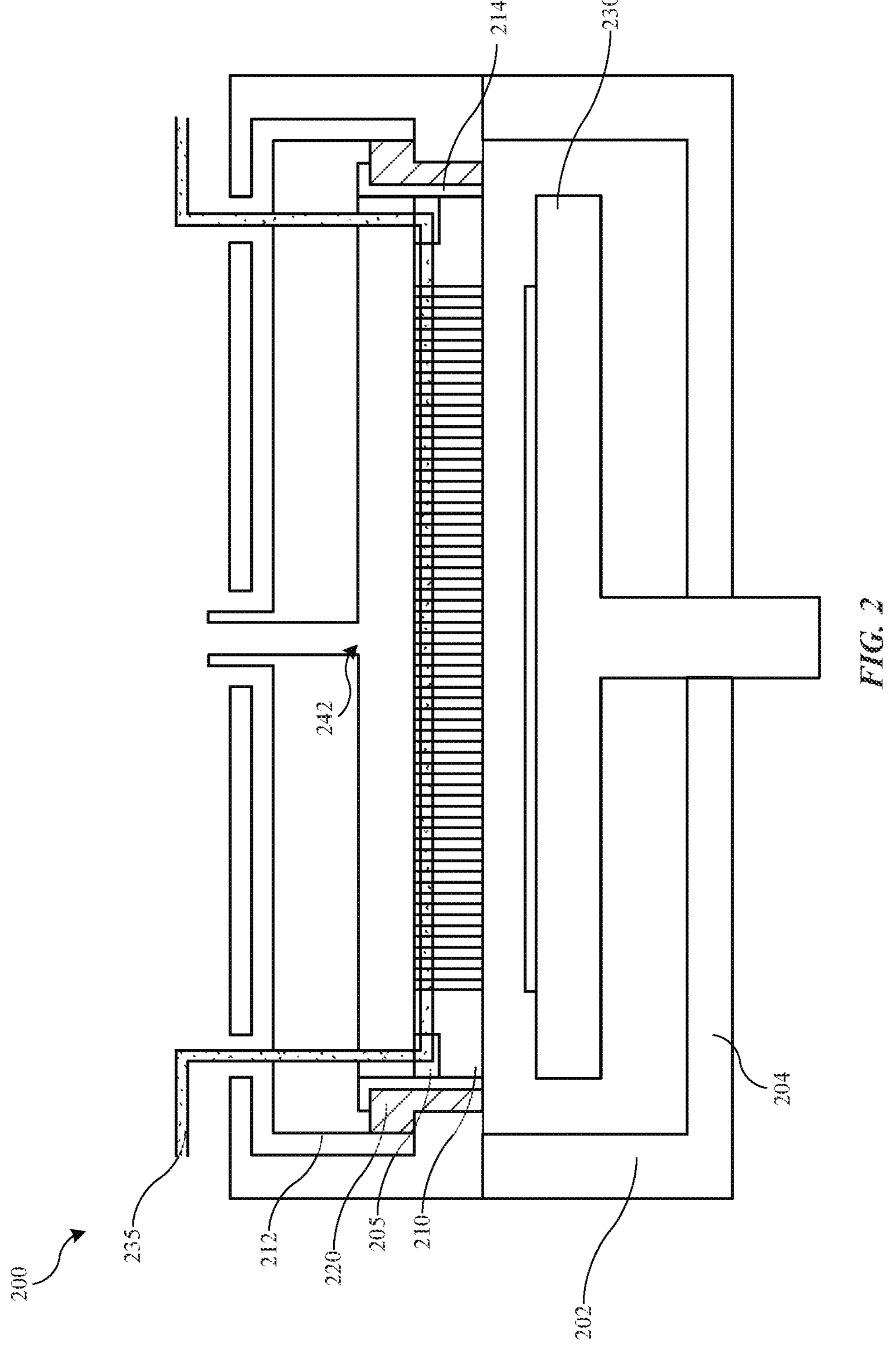
FIG. 2 shows a cross-sectional side elevation view of an exemplary substrate processing system with a cooling frame according to some embodiments of the present technology.

FIG. 2 shows a cross-sectional side elevation view of an exemplary substrate processing system according to some embodiments of the present technology. Chamber 200 may be similar to the chamber 100 and may include any of the features described in relation to chamber 100. For example, chamber 200 may include a chamber body that includes a number of chamber walls 202, a bottom 204, and a diffuser 210 that define a processing volume. A susceptor 230 may be disposed within the processing volume. Processing chamber 200 may also include a backing plate 212 disposed atop the chamber body. The backing plate 212 may define a gas outlet 242 through which gases and/or plasma may be delivered to the diffuser 210 for distribution to the processing volume. The diffuser 210 may be coupled with the backing plate 212 via one or more suspensions 214, which may couple with lateral surfaces of the diffuser 210. In some embodiments, an isolator 220 may be positioned between the diffuser 210 and the chamber walls 202. The isolator 220 may be formed of a polymeric material, such as polytetrafluoroethylene, in some embodiments.

Processing chamber 200 may include a cooling frame 205 that may be used to cool the diffuser 210. The cooling frame 205 may be included in any processing chamber 200 or system previously described, as well as any other chamber or system that may benefit from the cooling frame 205. For example, the cooling frame 205 may be used and positioned within the processing chamber 100 as described in relation to FIG. 1. The cooling frame 205 may be disposed between a backing plate 212 and a diffuser 210. In embodiments, the cooling frame 205 may be coupled with diffuser 210, such as with an upper surface of the diffuser 210. For example, the diffuser 210 may define a peripheral step on which the cooling frame 205 may be seated. This may enable the cooling frame 205 to be coupled with the diffuser 210 such that top surfaces of the components are at least substantially coplanar, which may help promote more uniform flow of gases and/or plasma over the surface of the diffuser 210. In other embodiments, the cooling frame 205 may be seated atop an upper surface of the diffuser 210 such that a top surface of the cooling frame 205 is above or below a top surface of the diffuser 210. It is also contemplated that the cooling frame 205 could be coupled with a lower surface of the diffuser 210. Additionally, two or more cooling frames 205 could be coupled with multiple surfaces of the diffuser 210.

The cooling frame 205 may, in part, define a flow path for a cooling fluid to be supplied to the processing chamber 200 and directed to proximate the diffuser 210. The flow path may partially be defined by the cooling frame 205 and may partially be defined by additional piping, tubing, etc. that may provide a cooling circuit that enables the cooling fluid to be flowed to/away from the diffuser 210. For example, as will be discussed in greater detail below, a flow path 235 may extend through the backing plate 212 and coupled one or more fluid sources (not shown) with one or more inlets and outlets of the cooling frame 205 for delivering cooling fluid to and from the cooling frame 205. This may enable the diffuser to be actively cooled during processing operations. The active cooling of the diffuser 210 may help reduce and/or eliminate issues associated with temperature increases of the diffuser during processing operations. The use of cooling frame 205 may therefore help improve deposition rates and film uniformity across the substrate or glass being processed, as well as help prevent damage to various components in the substrate processing system and/or substrate particle defects.

Figure 3A:
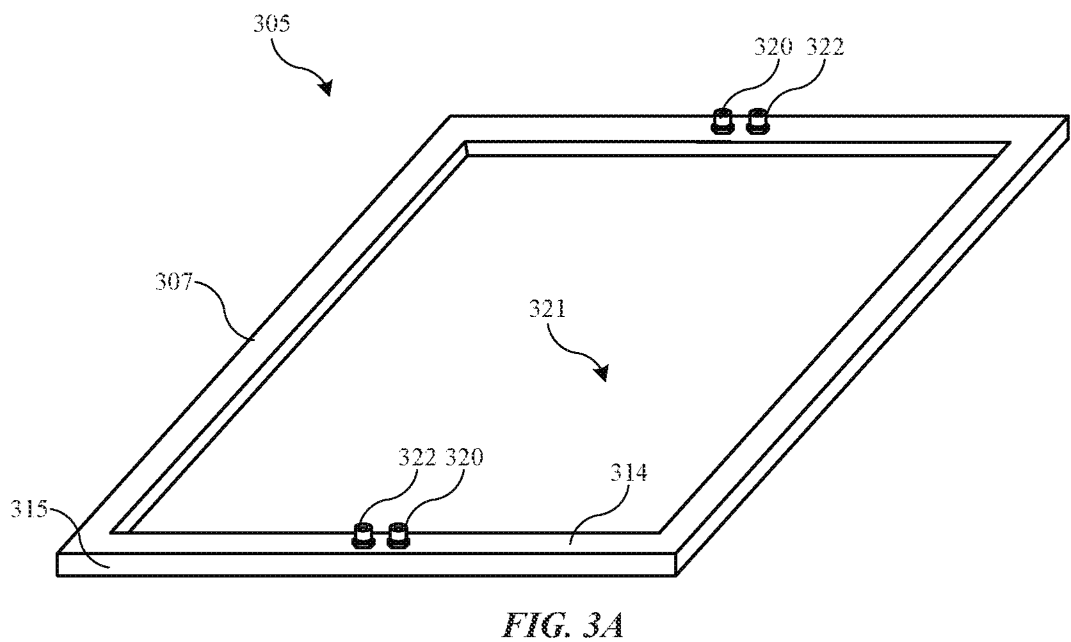
FIG. 3A shows a schematic isometric view of an exemplary cooling frame according to some embodiments of the present technology.

FIG. 3A illustrates a schematic isometric view of an exemplary cooling frame 305 according to some embodiments of the present technology. Cooling frame 305 may be similar to the cooling frame 205 and may include any of the features described in relation to cooling frame 205. Cooling frame 305 may include a body 307 having one or more fluid inlets 320 and one or more fluid outlets 322. The body 307 may have a generally rectangular shape, although the body 307 may have any other shape in various embodiments, such as circular, elliptical, and/or any other polygonal shape. The body 307 of the cooling frame 305 may define an opening 321. The opening 321 in the cooling frame 305 may allow processing gases to flow through gas passages in the diffuser once assembled. While the opening 321 defined by the body 307 of the cooling frame 305 may be sized according to the diffuser, the opening 321, such as in a center of the body 307, in embodiments, may be characterized by an area of greater than or about 0.05 $m^2$, greater than or about 0.1 $m^2$, greater than or about 0.25 $m^2$, greater than or about 0.5 $m^2$, greater than or about 0.75 $m^2$, greater than or about 1.0 $m^2$, and may be characterized by an area of greater than or about 2.0 $m^2$, greater than or about 3.0 $m^2$, greater than or about 4.0 $m^2$, greater than or about 5.0 $m^2$, or more. The area of the opening 321 defined by the body 307 of the cooling frame 305 may be limited by the cross-sectional area of the processing chamber.

Figure 3B:
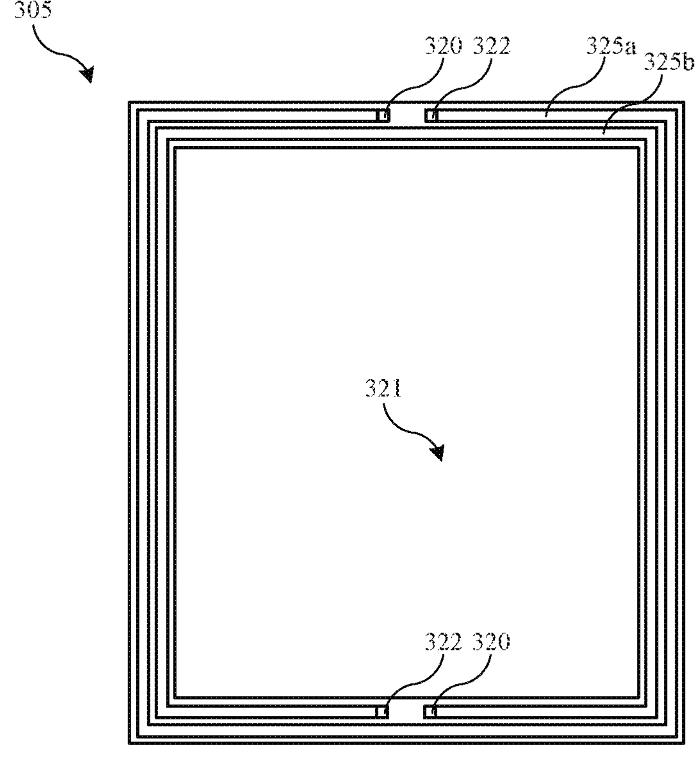
FIG. 3B shows a cross-sectional top plan view of the cooling frame of FIG. 3A.

As illustrated in FIG. 3A, the one or more fluid inlets 320 and/or one or more fluid outlets 322 of the cooling frame 305 may be positioned on an upper surface 314 of the body 307 of the cooling frame 305. However, the fluid inlets 320 and/or fluid outlets 322 may be positioned on any surface, such as a side surface 315 of the body 307 of the cooling frame 305. Additionally, the fluid inlets 320 and/or fluid outlets 322, when positioned on the upper surface 314 or side surface 315 of the body 307, may be positioned anywhere on the upper surface 314 or side surface 315 of the body 307, such as on longer sides or on shorter sides of the body 307 of the cooling frame 305. FIG. 3B shows a cross-sectional top plan view of cooling frame 305. As illustrated in FIG. 3B, the one or more fluid inlets 320 may be in fluid communication with the one or more fluid outlets 322 via one or more fluid lumens 325. The fluid lumens 325 may each extend at least partially about a periphery of the opening 321. For example, each fluid lumen 325 may extend about at least or about 10% of the periphery of the opening 321, at least or about 20%, at least or about 30%, at least or about 40%, at least or about 50%, at least or about 60%, at least or about 70%, at least or about 80%, at least or about 90%, at least or about 95%, or more. In some embodiments, a number of fluid lumens 325 may be arranged in end to end fashion, with the various fluid lumens 325 together extending about substantially (e.g., greater than or about 80%, greater than or about 90%, greater than or about 95%, or more) of the periphery of the opening 321. The fluid lumens 325 may be disposed in the body 307 of the cooling frame 305. The fluid lumens 325 may be any conduit, pipe, or channel that couples the fluid inlets 320 to the fluid outlets 322. That is, the fluid inlets 320 may provide access into the body 307 of the cooling frame 305 and to the fluid lumens 325. The fluid lumens 325 may then extend through at least a portion of the body 307 to the fluid outlets 322. The fluid outlets 322 may provide access out of the body 307 of the cooling frame 305. This enables a cooling fluid to be introduced to the fluid lumens 325 via the fluid inlets 320 and removed via the fluid outlets 322. In embodiments, the fluid lumens 325 may be and/or may include one or more sections of flexible tubing, one or more sections of rigid tubing, or may be machined into the body 307 of the cooling frame 305. For example, the cooling frame 30 may be formed from two halves (or other pieces) that may be coupled together. The fluid lumens 325 may be machined, formed, and/or otherwise provided within interior surfaces of one or both halves prior to the halves being joined to form the cooling frame 305.

In embodiments, the cooling frame 305 may include two or more fluid lumens 325. Accordingly, the cooling frame 305 may include two or more fluid inlets 320 and two or more fluid outlets 322. In embodiments having two or more fluid lumens 325, the fluid lumens 325 may extend in the same direction. However, it is also contemplated that at least one of the two or more fluid lumens 325 may extend clockwise about the body 307 of the cooling frame 305 while at least one of the two or more fluid lumens 325 may extend counter-clockwise about the body 307 of the cooling frame 305. The clockwise and counter-clockwise configurations may be observed from a top plan view of the cooling frame 305, such as is illustrated in FIG. 3B. With individual fluid lumens 325 passing fluid in opposite directions, a more uniform cooling of the diffuser may be promoted. As the fluid lumens 325 pass fluid in opposite directions, the cooling fluid in one fluid lumen 325 may be near the respective fluid outlet 322 while the cooling fluid in another fluid lumen 325 may be just entering the cooling frame 305 in another fluid lumen 325. Therefore, cooling fluid in one fluid lumen 325 that has already passed through a majority of the cooling frame 305 may be near its highest temperature while cooling fluid in the other fluid lumen 325 just entering the cooling frame 305 may be near its lowest temperature. Such a configuration may provide reduced temperature differences throughout the cooling frame 305 and may stabilize a temperature gradient throughout the cooling frame 305 and, therefore, the diffuser. In embodiments having two or more fluid lumens 325, the fluid lumens 325 may be disposed concentrically, when looking from a top plan view. For example, the cooling frame 305 may include an inner fluid lumen 325*a* and an outer fluid lumen 325*b* that is disposed radially outward of the inner fluid lumen 325*a*. However, it is also contemplated that the two or more fluid lumens 325 may be stacked vertically. Other configurations of the two or more fluid lumens 325, such as a double helix or interwoven configuration, are also contemplated. While shown with two fluid lumens 325, it will be appreciated that cooling frame 305 may include any number of fluid lumens 325. For example, the cooling frame 305 may include at least or about one fluid lumen, at least or about two fluid lumens, at least or about three fluid lumens, at least or about four fluid lumens, at least or about five fluid lumens, at least or about ten fluid lumens, or more.

The dimensions of the body 307 of the cooling frame 305 may be based on the diffuser and the fluid lumens 325. As will be further described below, the cooling frame 305 may be coupled, seated on, or attached to the diffuser. Therefore, the length and width of the cooling frame 305 may be approximately the length and width, respectively, of the diffuser. A thickness or height of the body 307 of the cooling frame 305 may be large enough to house the fluid lumens 325. In order to provide maximum cooling efficiency, the body 307 of the cooling frame 305 may be thick or high enough only to fit the fluid lumens 325 without a void between the fluid lumens 325 and the body 307. The size of the fluid lumens 325 may be dependent on the amount of cooling needed and, therefore, the amount of cooling fluid necessary to pass through the fluid lumens 325.

Figures 3C, 3D:
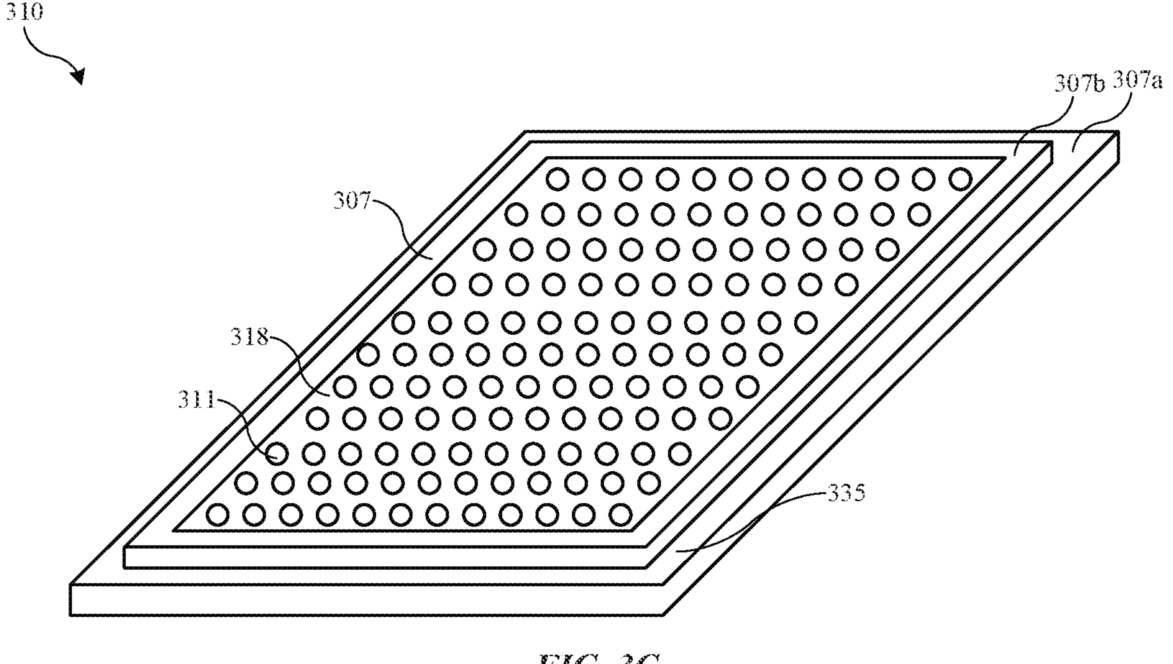
FIG. 3C shows a schematic isometric view of an exemplary diffuser according to some embodiments of the present technology.
FIG. 3D shows a partial cross-sectional side elevation view of the cooling frame and diffuser of FIGS. 3A-3C according to some embodiments of the present technology.

FIG. 3C shows a schematic isometric view of an exemplary diffuser 310 according to some embodiments of the present technology. Diffuser 310 may be similar to the diffuser 110 and may include any of the features described in relation to diffuser 110. Diffuser 310 may include a body 307. The body 307 of the diffuser 310 may have a generally rectangular shape, although the body 307 may have any other shape in various embodiments, such as circular, elliptical, and/or any other polygonal shape. The body 307 of the diffuser 310 may have an upper surface 318. The upper surface 318 of the diffuser 310 may define have a plurality of gas passages 311 that may allow processing gases to flow through the diffuser 310.

The body 3107 of the diffuser 310 may have a stepped profile. For example, a lower portion 307*a* of the body 37 may extend radially outward beyond an upper portion 307*b* of the body 37 such that the lower portion 307*a* forms a step 335 that extends from a lateral surface of the upper portion 307*b*. The step 335 may form a ledge, flange, or collar about the lower portion of the body 307 of the diffuser 310. The step 335 may extend around the entire outer periphery of the body 307 of the diffuser 310 or may be discontinuous. The lower portion 307*a* and the upper portion 307*b* may be the same thickness or height. In embodiments, the lower portion 307*a* and the upper portion 307*b* may be different thicknesses heights. The thicknesses or heights may be selected depending on the process and the amount of heating/cooling in the processing chamber. As described below, the step 335 may receive and hold the cooling frame (such as cooling frame 305). The body 307 of the diffuser 310, and step 335, may be complementary to the shape of the cooling frame.

In embodiments where the cooling frame is positioned on a bottom surface of the diffuser 310, the step may be such that the upper portion 307*b* of the body 307 may extend outward beyond the lower portion 307*a* of the body 307. For example, rather than forming a ledge, the step may form an overhang that extends beyond the lower portion 307*b* of the body 307. While not illustrated, it is contemplated that instead of, or in addition to, a step profile, a groove may be formed around the body 307 of the diffuser 310 to receive the cooling frame 305.

FIG. 3D shows a partial cross-sectional side view of cooling frame 305 interfaced with diffuser 310 according to some embodiments of the present technology. The cooling frame 305 may be seated or disposed along an upper surface 318 of the diffuser 310, such as on step 335 (as shown in FIG. 3C). As illustrated, the upper surface 314 of the cooling frame 305 and the upper surface 318 of the diffuser 310 may be at least substantially coplanar, such that the diffuser 310 may be received within the stepped profile of the diffuser 310. The cooling frame 305 may be attached or coupled with the outer periphery of the upper portion, an outer periphery of the lower portion, or may be attached to an upper surface of the lower portion. An outermost side of the diffuser 310 and the outer edge of the cooling frame 305 may be at least substantially coplanar. As illustrated, a gap 319 may remain between vertical sidewalls of the diffuser 310 and cooling frame 305 to allow room for any thermal expansion due to temperature changes during processing operations. While the diffuser 310 and cooling frame 305 may be the same material or materials with similar CTE values, the components may be different materials or may expand at different rates during processing. This gap 319 may allow for expansion of either component during processing. In other embodiments, the vertical sidewalls of the diffuser 310 and cooling frame 305 may be in contact with one another.

As illustrated, the fluid lumens 325 may have a generally rectangular cross-sectional shape, although the fluid lumens 325 may have any other shape in various embodiments, such as circular, elliptical, and/or any other polygonal shape. As previously discussed, sizing of the fluid lumens 325 may depend on the amount of cooling needed during processing and on the amount of cooling fluid to be flowed through the fluid lumens 325. In embodiments, the fluid lumens 325 may have a diameter of greater than or about 5.0 mm, and may have a diameter greater than or about 6.0 mm, greater than or about 7.0 mm, greater than or about 8.0 mm, greater than or about 9.0 mm, greater than or about 10.0 mm, greater than or about 15.0 mm, greater than or about 20.0 mm, greater than or about 25.0 mm, greater than or about 50.0 mm, greater than or about 75.0 mm, or more. A diameter may be limited by space available in the processing chamber and may be less than or about 500.0 mm. The cross-sectional diameter may be constant and/or may vary across a length of each fluid lumen 325. In embodiments having multiple fluid lumens 325, each fluid lumen may have a same cross-sectional sizes and/or shapes. In other embodiments, some or all of the fluid lumens 325 may have different cross-sectional sizes and/or shapes.

In embodiments, the size of the fluid lumens 325 may be based on an internal volume of the body 317 of the cooling frame 305. Together, the one or more fluid lumens 325 may occupy greater than or about 10.0% of the internal volume of the body 317 of the cooling frame 305, and may occupy greater than or about 20.0%, greater than or about 30.0%, greater than or about 40.0%, greater than or about 50.0%, greater than or about 60.0%, greater than or about 70.0%, greater than or about 80.0%, greater than or about 90.0%, or more.

The cooling frame 305 may be attached to the diffuser 310, such as an upper surface of the diffuser 310 (e.g., atop step 335), via indium bonding 330. It is contemplated that any type of attaching, bonding, or brazing may be used to join the cooling frame 305 and the diffuser 310. However, indium bonding 330 may have desirable thermal conductivity properties and may efficiently draw heat from the diffuser 310 to maintain the diffuser 310 within a desired operating temperature range. In embodiments, the cooling frame 305 may additionally or alternatively be attached to the outer periphery of the upper portion of the diffuser 310 via any type of attaching, bonding, or brazing, including indium bonding 330.

As best illustrated in FIG. 3D, the diffuser 310 may include a groove or notch 355 around the lower portion. The groove or notch 355 may be complementary to a diffuser skirt or other suspension (not shown) that supports the diffuser 310 in the processing chamber.

Figure 4:
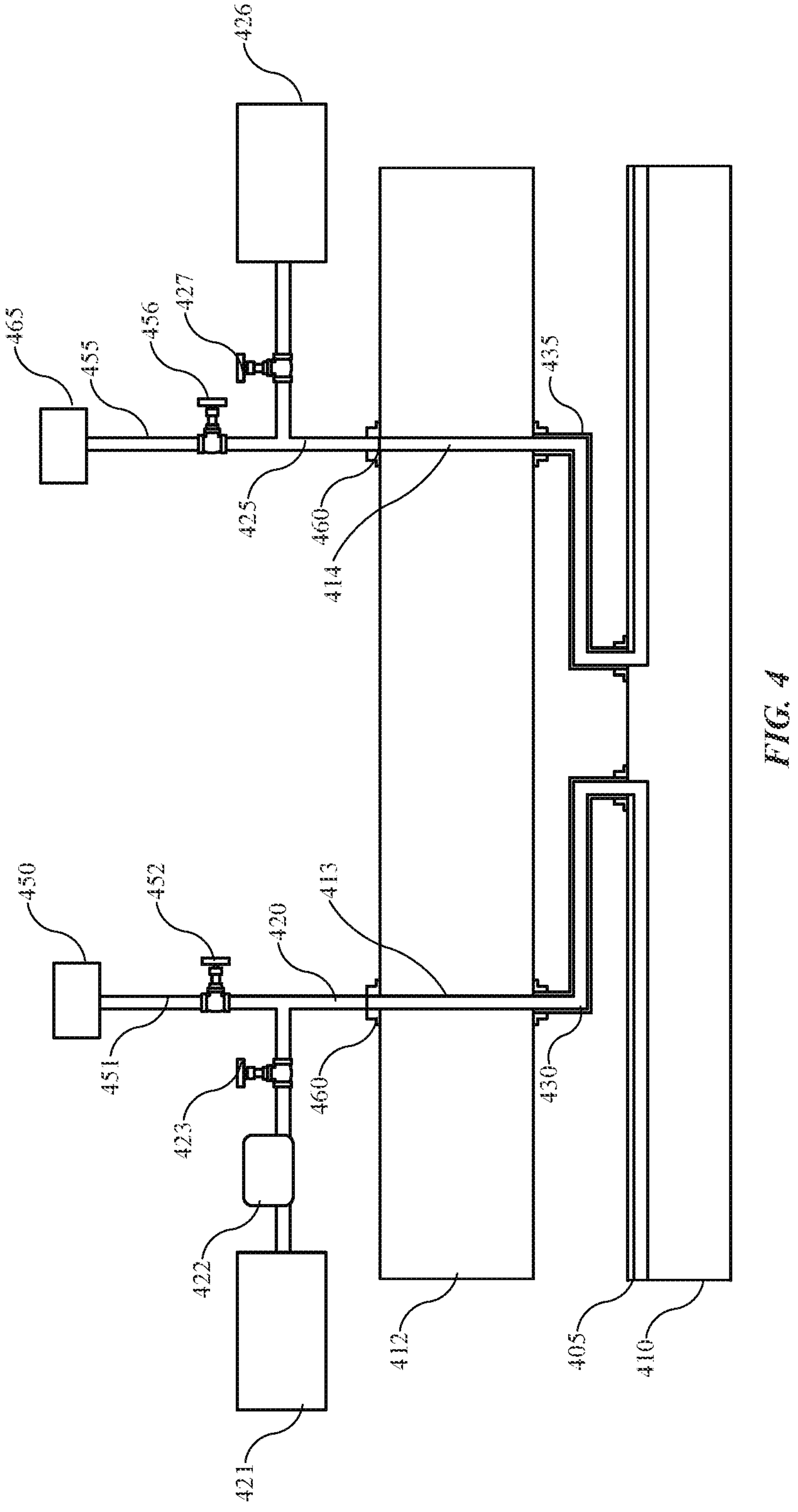
FIG. 4 shows a cross-sectional partial side elevation view of an exemplary substrate processing system according to some embodiments of the present technology.

FIG. 4 shows a cross-sectional partial side elevation view of an exemplary substrate processing system according to some embodiments of the present technology. Chamber 400 may be similar to the chamber 100 and may include any of the features described in relation to chamber 100. For example, chamber 400 may include a chamber body that includes a number of chamber walls. A diffuser 410 may be disposed within the chamber body. Diffuser 410 may be similar to diffuser 110 and 310 described herein and may include any of the features described in relation to diffuser 110 and 310. For example, the diffuser 410 may include a stepped profile. A cooling frame 405 may be disposed within the chamber body. For example, the cooling frame 405 may be seated atop a step formed in the diffuser 410. Cooling frame 405 may be similar to cooling frame 205 and 305 described herein and may include any of the features described in relation to cooling frame 205 and 305.

The backing plate 412 may define one or more supply channels 413 and one or more return channels 414 that extend through a thickness of the backing plate 412. The one or more supply channels 413 may be in fluid communication with a fluid supply circuit 420 that may include one or more fluid supply lumens that extend between and couple various components of the fluid supply circuit. The one or more return channels 414 may be in fluid communication with a fluid return circuit 425 that may include one or more fluid return lumens that extend between and couple various components of the fluid return circuit. The supply channels 413 and the return channels 414 may be substantially vertical and may extend through an upper surface and lower surface of the backing plate 412. The supply channels 413 and return channels 414 may be any conduit, pipe, or channel that extends from the upper surface of the backing plate 412 to the lower surface of the backing plate 412. Additional conduits, tubing, or lumens, such as fluid supply lumens 430, may extend between attach the supply channels 413 to the fluid inlets of the cooling frame 405. Similarly, additional conduits, tubing, or lumens, such as fluid return lumens 435 may extend between and attach the fluid outlets of the cooling frame 405 to the return channels 414. The fluid supply lumens 430 and/or fluid return lumens 435 may be formed from flexible tubing and/or rigid pipes and/or other conduits.

The fluid supply circuit 420 may be in fluid communication with a fluid source 421. The fluid supply circuit 420 may extend from a fluid source 421 and couple with a flow controller 422 and/or a fluid supply valve 423 that may be disposed downstream of the fluid source 421. Thus, fluid may flow from the fluid source 421 into the fluid supply circuit 420, which may deliver the fluid through the flow controller 422. The flow controller 422 may have an inlet and an outlet, with the inlet and outlet being coupled with the fluid supply circuit 420. The flow controller 422 may meter and/or otherwise control the flow of fluid in the fluid supply circuit 420. After being passed out of the flow controller 422, the fluid may pass through a fluid supply valve 423. The fluid supply valve 423 may include an inlet and an outlet, with the inlet and outlet being coupled with the fluid supply circuit 420. The fluid supply valve 423 may allow fluid to pass downstream to the cooling frame 405 (such as via supply channels 413 and/or fluid supply lumen 430) when in an open position and may restrict flow in an off position.

Similar to the fluid supply circuit 420, the fluid return circuit 425 may be in fluid communication with a fluid return 426. In embodiments, the fluid supply circuit 420 and fluid return circuit 425 may form a complete or closed loop. In such embodiments, the fluid source 421 and the fluid return 426 may be a single unit and may recycle the fluid after it has been passed through the cooling frame 405. That is, fluid may flow from the cooling frame 405 into the fluid return circuit 425 via the fluid outlet (such as via fluid return lumens 435 and/or return channels 414). After flowing into fluid return circuit 425, the fluid return circuit 425 may pass a fluid return valve 427. The fluid return valve 427 may include an inlet and an outlet, with the inlet and outlet being coupled with the fluid return circuit 425. The fluid return valve 427 may allow fluid to pass downstream to the fluid return 426 when in an open position and may restrict flow in an off position. The fluid return valve 427 may prevent any backstreaming after the fluid is passed out of the cooling frame 405.

The substrate processing system may also include a plurality of connectors 460. The connectors 460 may join the fluid supply circuit 420 and fluid return circuit 425 to the supply channels 413 and return channels 414 defined in the backing plate 412 and to the cooling frame 405. The connectors 460 may be any type of connector and may be selected depending on the type of lumens being used. For example, the connectors 460 may be flange fittings or other similar fittings to attach the lumens to the various components.

In embodiments, the substrate processing system may include an inert supply 450 in fluid communication with the fluid inlet of the cooling frame 405. The inert supply lumen 451 may follow the same flow path, such as through a portion of the fluid supply circuit 420, the supply channel 413 in the backing plate 412, and/or fluid supply lumens 430. Also similar to the other lumens previously discussed, the inert supply lumen 451 may include an inert supply valve 452. The inert supply valve 452 may include an inlet and an outlet, with the inlet and outlet being coupled with the inert supply lumen 451. The inert supply valve 452 may allow fluid to pass downstream to the cooling frame 405 when in an open position and may restrict flow in an off position. The substrate processing system may also include an inert return lumen 455. The inert return lumen 455 may be in fluid communication with the fluid outlet of the cooling frame 405, for example, via the fluid return lumen 435, return channel 414, and fluid return circuit 425. The inert return valve 456 may include an inlet and an outlet, with the inlet and outlet being coupled with the inert return lumen 455. The inert return valve 456 may allow fluid from the cooling frame 405 to be delivered to a drain 465 when in the open position and may restrict flow in the off position. The inert return valve may prevent any backstreaming after the fluid is passed out of the cooling frame 405.

Figure 5:
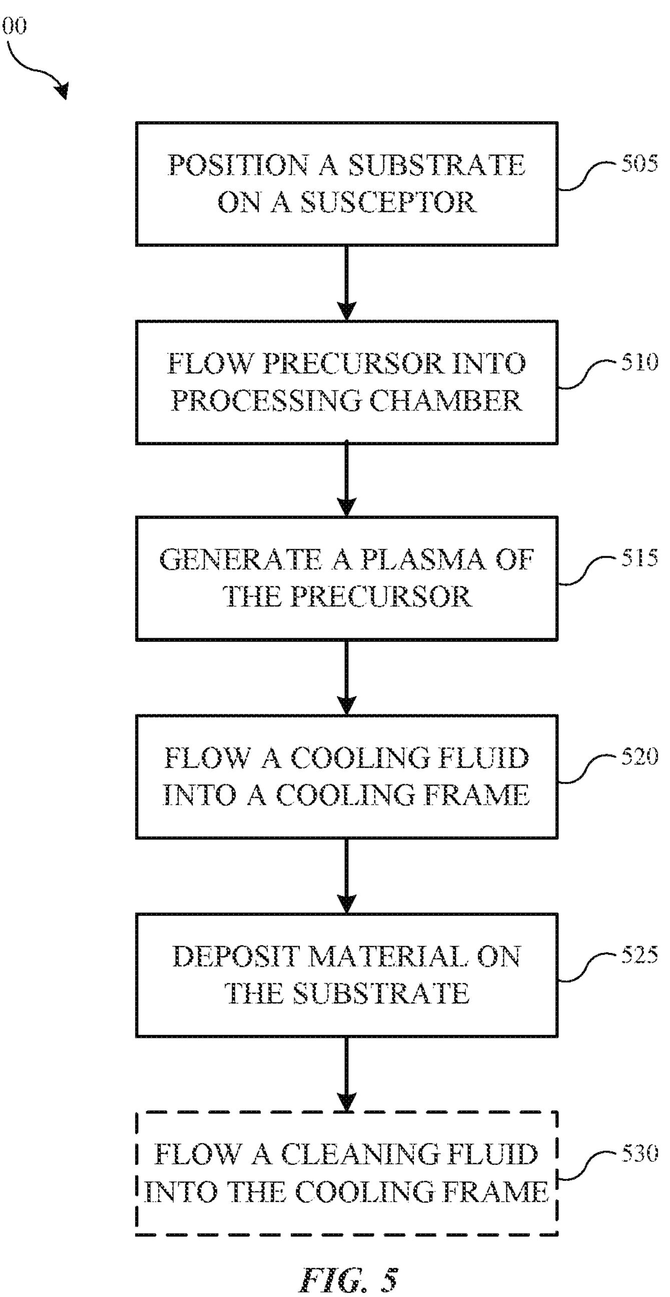
FIG. 5 shows operations of an exemplary method of semiconductor processing according to some embodiments of the present technology.

FIG. 5 illustrates operations of an exemplary method 500 of semiconductor processing according to some embodiments of the present technology. The method may be performed in a variety of processing chambers, including chamber 100, 200, or 400 described above, which may include cooling frames according to embodiments of the present technology, such as cooling frame 205, 305, or 405. Method 500 may include a number of optional operations, which may or may not be specifically associated with some embodiments of methods according to the present technology.

Method 500 may include a processing method that may include operations for forming a hardmask film or other deposition operations. The method may include optional operations prior to initiation of method 500, or the method may include additional operations during or subsequent of method 500. For example, method 500 may include operations performed in different orders than illustrated. Method 500 may include positioning a substrate on a susceptor, such as a support plate of a susceptor, that is disposed within a processing chamber at operation 505. For example, the substrate may be positioned on a substrate receiving surface of the susceptor. At operation 510, the method may include flowing one or more precursors or other process gases into a processing chamber. For example, the precursor may be flowed into a chamber, such as chamber 100, 200, or 400, and may flow the precursor through a diffuser, prior to delivering the precursor into a processing region of the chamber. At operation 515, a plasma may be generated of the precursors within the processing region, such as by providing RF power to the faceplate to generate a plasma. In some embodiments, a plasma may be generated at a remote plasma source and delivered to the processing region via the diffuser.

The method 500 may include flowing a cooling fluid into a cooling frame, such as cooling frame 205, 305, or 405, at operation 520. The cooling fluid, which may be deionized water, may maintain a temperature of the diffuser at or below a desired threshold, such as less than or about 150° C., less than or about 140° C., less than or about 130° C., less than or about 120° C., less than or about 110° C., less than or about 100° C., less than or about 90° C., less than or about 80° C., or less. For example a temperature of the cooling fluid may be between or about 25° C. and 150° C., between or about 50° C. and 125° C., between or about 55° C. and 100° C., with the temperature being dependent on the particular processing operation being performed. While shown as an operation subsequent to flowing the one or more precursors at operation 510 and generating a plasma of the one or more precursors at operation 515, flowing the cooling fluid may begin at any time during method 500. For example, the cooling fluid may be flowed simultaneously to position the substrate at operation 505 or simultaneously to flowing the one or more precursors at operation 510. At operation 525, material formed in the plasma may be deposited on the substrate.

In embodiments, at optional operation 530, the method 500 may include halting the flow of the precursor and the cooling fluid. The method 500 may also include flowing a cleaning fluid into the cooling frame. The cleaning fluid, such as diatomic nitrogen or any other inert fluid, may purge and/or clean the cooling frame during maintenance operations.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a diffuser" includes a plurality of such diffusers, and reference to "the cooling frame" includes reference to one or more cooling frames and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A diffuser cooling frame, comprising:

a body having two or more fluid inlets and two or more fluid outlets, wherein:

the body defines an opening;

the two or more fluid inlets are in fluid communication with the two or more fluid outlets via two or more fluid lumens; and the two or more fluid lumens form two or more fluid passageways around an outer perimeter of the body of the diffuser cooling frame; and wherein the two or more fluid lumens each connect one of the fluid inlets to a respective one of the fluid outlets, wherein:

a first fluid lumen, of the two or more fluid lumens, extends about substantially all of an outer periphery of the opening;

a second fluid lumen, of the two or more fluid lumens, extends about substantially all of the outer periphery of the opening, wherein the second fluid lumen is disposed radially inward of the first fluid lumen;

a first fluid path defined by a first fluid lumen of the two or more fluid lumens extends clockwise around the body of the diffuser cooling frame; and a second fluid path defined by a second fluid lumen of the two or more fluid lumens extends counter-clockwise around the body of the diffuser cooling frame.

2. The diffuser cooling frame of claim 1, wherein: the opening comprises an area of greater than or about 0.05 $m^2$.

3. The diffuser cooling frame of claim 1, wherein:

the one or more fluid inlets and one or more fluid outlets are positioned on an upper surface of the diffuser cooling frame.

4. The diffuser cooling frame of claim 1, wherein:

the diffuser cooling frame is coupled with a diffuser.

5. The diffuser cooling frame of claim 4, wherein:

the diffuser cooling frame is attached to an upper surface of the diffuser via indium bonding.

6. The diffuser cooling frame of claim 4, wherein: the outer perimeter of the diffuser comprises a stepped profile.

7. The diffuser cooling frame of claim 1, wherein:

the body of the diffuser cooling frame, the one or more fluid lumens, or both are constructed from an aluminum alloy.

8. A substrate processing method comprising:

positioning a substrate on a susceptor that is disposed within a processing chamber;

flowing a precursor into the processing chamber through a diffuser;

generating a plasma of the precursor within a processing region of the processing chamber;

flowing a cooling fluid into a cooling frame disposed above the diffuser, wherein the cooling frame comprises the diffuser cooling frame according to claim 1; and depositing a material on the substrate.

9. The substrate processing method of claim 8, wherein:

the cooling fluid maintains a temperature of the diffuser at less than or about 150° C.

10. The substrate processing method of claim 8, further comprising:

subsequent to depositing a material on the substrate, halting the flow of the precursor and the cooling fluid; and flowing a cleaning fluid into the cooling frame.

11. The substrate processing method of claim 8, wherein:

the cooling fluid comprises deionized water.

12. The diffuser cooling frame of claim 4, wherein the diffuser comprises a plurality of gas passages.

13. A substrate processing chamber, comprising:

a chamber body defining a processing region;

a backing plate disposed atop the chamber body;

a diffuser above the processing region and supported by the backing plate; and a cooling frame disposed between the backing plate and the diffuser, the cooling frame being coupled with the diffuser, wherein:

the cooling frame comprises a diffuser cooling frame according to claim 1; and the one or more fluid inlets are in fluid communication with one or more fluid supply lumens; and the one or more fluid outlets are in fluid communication with one or more fluid return lumens.

14. The substrate processing chamber of claim 13, wherein:

the cooling frame is disposed along an upper surface of the diffuser.

15. The substrate processing chamber of claim 13, wherein:

the cooling frame is attached to an upper surface of the diffuser via indium bonding.

16. The substrate processing chamber of claim 13, wherein:

the body of the cooling frame extends about an outer periphery of the diffuser.

17. The substrate processing chamber of claim 16, wherein:

the outer periphery of the diffuser comprises a stepped profile that receives the cooling frame.

18. The substrate processing chamber of claim 13, wherein:

the one or more fluid lumens comprise one or more sections of flexible tubing.

19. The substrate processing chamber of claim 13, wherein:

the backing plate defines one or more supply channels in fluid communication with the one or more fluid supply lumens; and the backing plate defines one or more return channels in fluid communication with the one or more fluid return lumens.

20. The substrate processing chamber of claim 13, further comprising:

a cleaning fluid supply lumen in fluid communication with the one or more fluid inlets; and a cleaning fluid return lumen in fluid communication with the one or more fluid outlets.

* * * * *